(12) United States Patent
Chong et al.

(10) Patent No.: US 7,047,361 B2
(45) Date of Patent: May 16, 2006

(54) DATA STORAGE DEVICE USING SDRAM

(75) Inventors: Shuar Jiun Chong, Hsinchu Hsien (TW); Chih Jen Hsu, Hsinchu Hsien (TW)

(73) Assignee: Phison Electronics Corp., Hsinchu Hsien (TW)

( * ) Notice: Subject to any disclaimer, the term of this patent is extended or adjusted under 35 U.S.C. 154(b) by 340 days.

(21) Appl. No.: 10/632,924

(22) Filed: Aug. 4, 2003

(65) Prior Publication Data

US 2005/0033908 A1 Feb. 10, 2005

(51) Int. Cl.
G06F 12/02 (2006.01)

(52) U.S. Cl. ..................................... 711/115

(58) Field of Classification Search ................ 711/105, 711/115
See application file for complete search history.

(56) References Cited

U.S. PATENT DOCUMENTS

| 6,920,527 | B1* | 7/2005 | Cloutier et al. ............. 711/115 |
| 2002/0080541 | A1* | 6/2002 | Bunker et al. ................ 361/72 |
| 2003/0158614 | A1* | 8/2003 | Friel et al. .................... 700/94 |
| 2004/0153851 | A1* | 8/2004 | Venugopal et al. ........... 714/43 |

* cited by examiner

Primary Examiner—Kevin L. Ellis
(74) Attorney, Agent, or Firm—Bacon & Thomas, PLLC

(57) ABSTRACT

A data storage device using SDRAM as data storage unit is disclosed. The data storage device of the present invention comprises a SDRAM controller is used to control one or more than one SDRAM. According to an aspect of the present invention, a plurality of SDRAM is stacked over each other to form stacked SDRAM structure for increasing the storage capacity. The data storage device of the present invention is capable of continuously and accurately storing and retrieving data, and it is highly resistant to vibrations. Further, the data storage device of the present invention is capable of reducing the manufacturing and maintenance cost.

16 Claims, 3 Drawing Sheets

DATA STORAGE DEVICE USING SDRAM

BACKGROUND OF THE INVENTION

1. The Field of the Invention

The present invention generally relates to a data storage device, and more particularly relates to a data storage device using a SDRAM controller to control one or more than one SDRAM for data storage.

2. Description of the Related Art

The conventional data storage device, such as the hard disk driver, which uses a magnetic element and a motor controlled reading head mechanism to store data, was popular some time ago. However, with the rapid advancement of the information technology and semiconductor know-how, flash memory has been developed for data storage by electrical means. The hard disk driver has advantages over the flash memory, for example, the hard disk driver has more storage capacity and inexpensive compared to the flash memory. However, the disadvantages of the hard disk is that it is larger in size occupying larger space and less resistant to vibrations due to the limit set by the motor controlled reading head mechanism, and therefore the track may get damaged during transportation thereby increasing the maintenance cost of the hard disk. The advantages of using the flash memory as the data storage device compared to hard disk is that it occupies less space and more resistant to vibration. However the flash memory cell structure is vulnerable to error caused by the difficulty of controlling manufacturing process, and therefore the price is much higher than the hard disk driver for the same data storage capacity. Accordingly, with consideration of cost, the flash memory is less attractive.

Therefore, in the light of the foregoing, it is highly desirable to lower the manufacturing cost of the data storage device and at the same time improve the accuracy of data storage features of the data storage device.

SUMMARY OF THE INVENTION

Accordingly, in the view of the foregoing, the present inventor makes a detailed study of related art to evaluate and consider, and uses years of accumulated experience in this field, and through several experiments, to create a new data storage device using SDRAM that is capable of reducing the manufacturing and maintenance cost and at the same time the accuracy of data storage features is also increased.

According to a primary aspect of the present invention, a data storage device using SDRAM as data storage unit is provided. Further, a SDRAM controller is used to control one or more than one SDRAM.

According to another aspect of the present invention, a plurality of SDRAM is stacked over each other to form stacked SDRAM for increasing the storage capacity. The data storage device of the present invention is capable of continuously and accurately storing and retrieving data, and it is highly resistant to vibrations. Further, the data storage device of the present invention is capable of reducing the manufacturing and maintenance cost.

BRIEF DESCRIPTION OF THE DRAWING

For a more complete understanding of the present invention, reference will now be made to the following detailed description of preferred embodiments taken in conjunction with the accompanying drawings, in which.

DETAILED DESCRIPTION OF PREFERRED EMBODIMENTS

Figure 1:
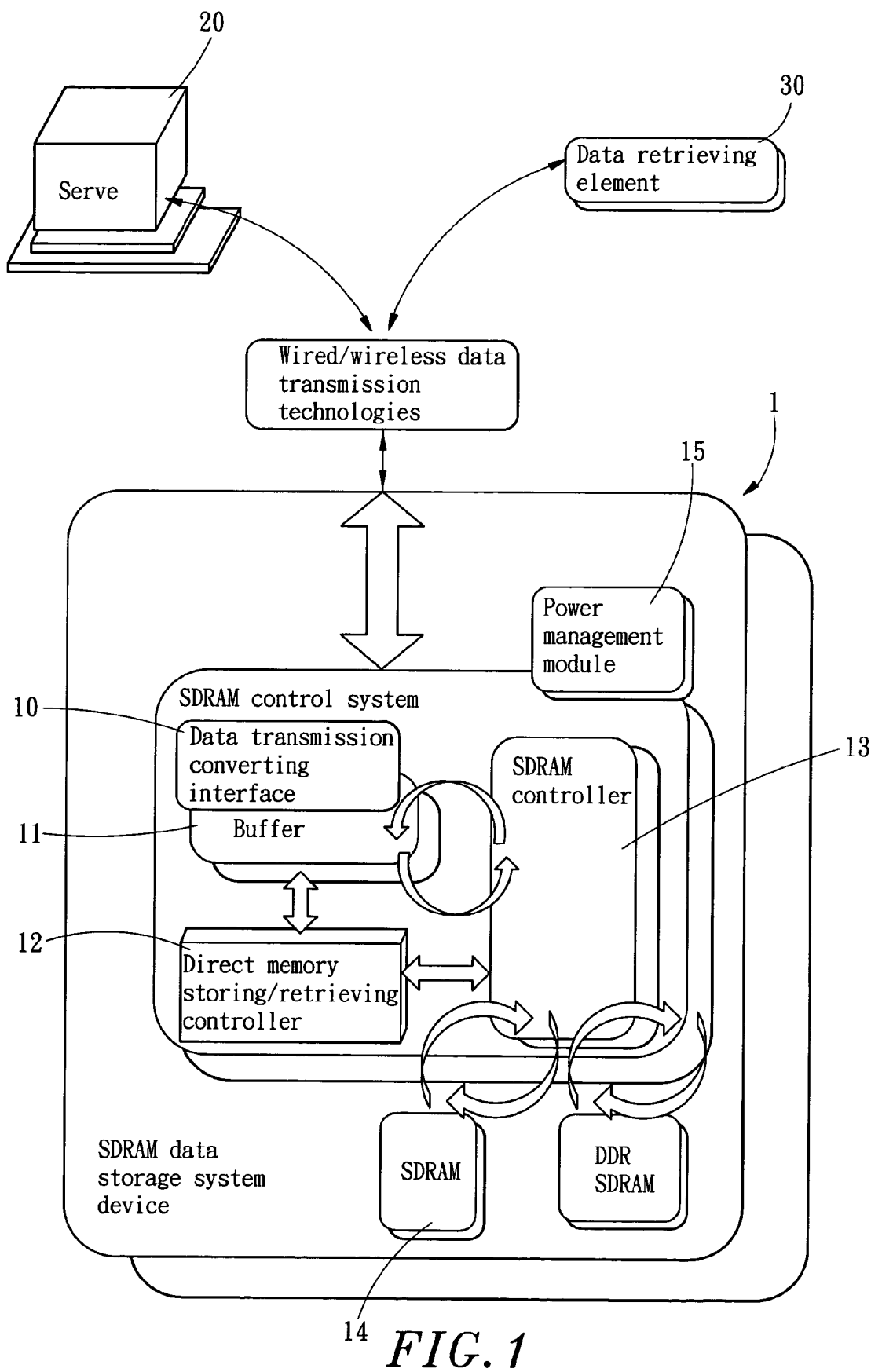
FIG. 1 is a block layout of a data storage system device using SDRAM of the present invention.

Reference will be made in detail to the preferred embodiments of the invention, examples of which are illustrated in the accompanying drawings. Wherever possible, the same reference numbers are used in the drawings and the description to refer to the same or like parts.

The present invention relates to a data storage device using SDRAM. Referring to FIG. 1, the data storage device 1 comprises a data transmission converting interface 10, a buffer 11, a direct memory storing/retrieving controller 12, a SDRAM controller 13 and at least SDRAM 14. Wherein the data transmission converting interface 10 is connected to a server 20 (such as computer) through wired or wireless means so that the data of the server 20 can be converted by the data transmission converting interface 10 into the storable data that can be saved and stored in the buffer 11. The SDRAM controller 13 controls the direct memory storing/retrieving controller 12 to store the data in the buffer 11 to the SDRAM 14. Either way, the server 20 controls the SDRAM controller 13 to retrieve data from the SDRAM 14.

Referring to FIG. 1 again, the data storage device 1 is connected to a data retrieving element 30 through a data transmission converting interface 10, such as a CCD or a CMOS image sensor element, to enable current signal retrieved by the data retrieving element 30 to be converted into the storable data by the data transmission converting interface 10 that can be to saved and stored in the buffer 11. When the SDRAM controller 13 controls the direct memory storing/retrieving controller 12 again, the direct memory storing/retrieving controller 12 will move the data that is temporarily stored in the buffer 11 to store into the SDRAM 14.

As shown in FIG. 1, the SDRAM 14 may be comprised of a DDR SDRAM.

Additionally, the data storage device 1 comprises a power management module 15 and a dry cell (not shown). When the power management module 15 detects low power supply to the data storage device 1, the power management module 15 switches to the dry cell to supply power to the SDRAM 14, to enable the SDRAM 14 to refresh. Besides, with the advanced semiconductor manufacturing process, the SDRAM 14 consumes less power, and a common dry cell is capable of supplying power to a SDRAM 14 for years.

In the present invention, also shown in FIG. 1, the data retrieving element 30 is an element capable of converting the external data, such as image, sound, light, temperature and so on, into storable data.

Figure 2:
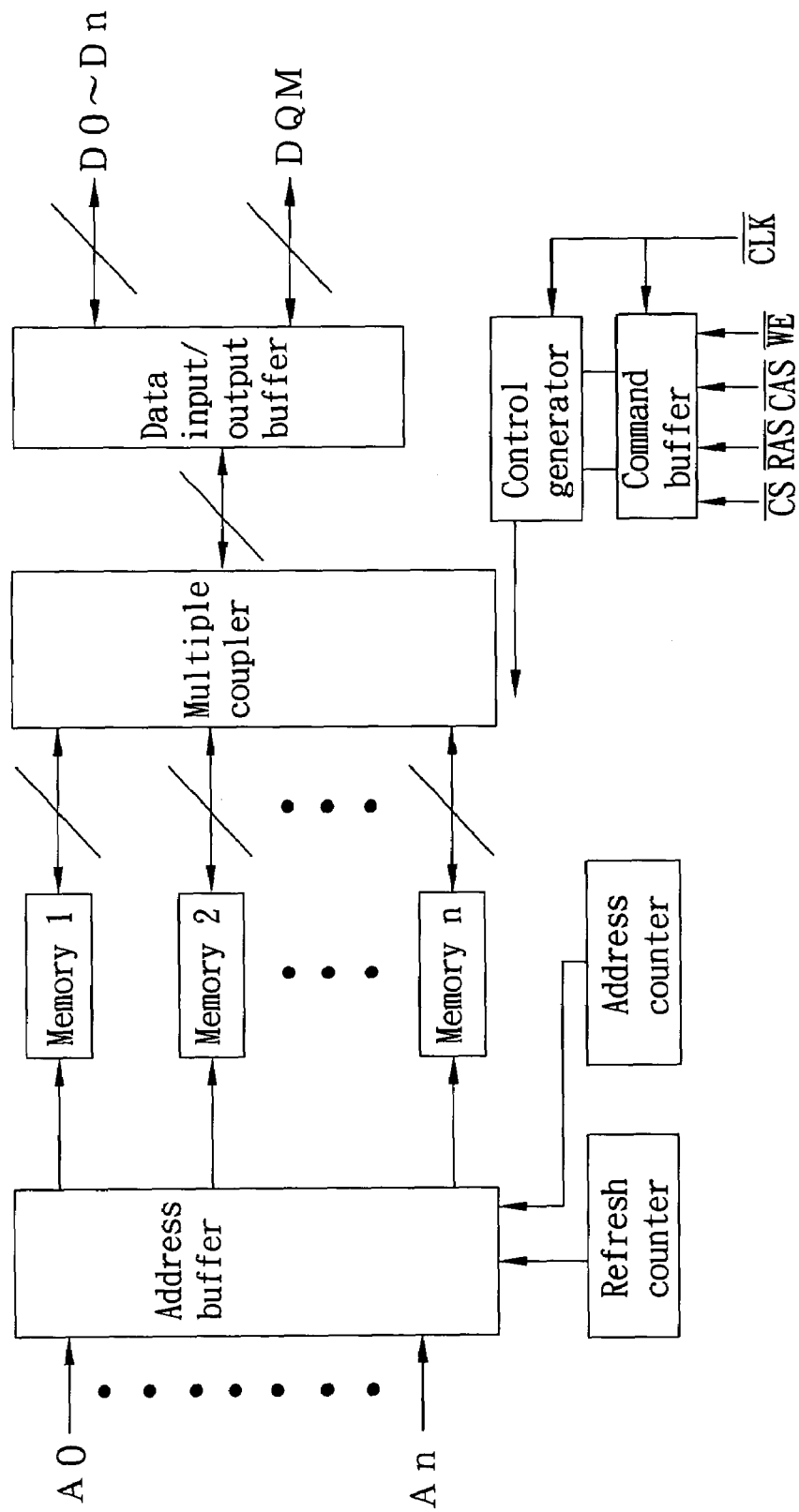
FIG. 2 is a simplified block diagram of the SDRAM according to one preferred embodiment of the present invention.

Referring to FIG. 2, the charging time affects the speed of the conventional DRAM, and therefore it is difficult to improve random saving/retrieving time for slitting data, but the address of the next set of data is detectable using the burst mode to save/retrieve data. Therefore, the SDRAM uses interleaved memory module and multi-pipeline technologies to improve the saving/retrieving time of the DRAM in the burst mode. As the continuous saving/retrieving can achieve the synchronous saving/retrieving efficiency as an external clock, and therefore such kind of DRAM is called SDRAM (synchronous DRAM).

Figure 3:
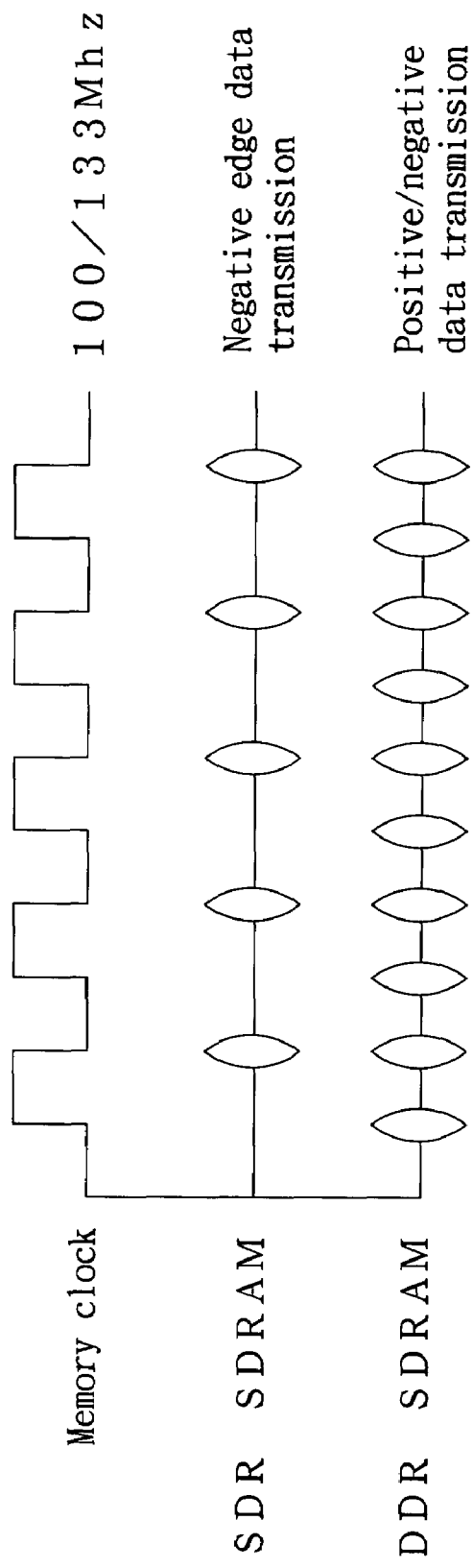
FIG. 3 is a data comparison of SDR SDRAM and DDR SDRAM.

Furthermore, referring to FIG. 3 DDR SDRAM means double data rate, uses the positive edge and negative edge of the memory clock to present the data once separately, and that's how the data transmission efficiency can be twice that of SDRAM, and whereas in the SDRAM data is shown only in the negative edge of the memory clock, and therefore it is called SDR SDRAM. Additionally, a 2.2 V of DDR SDRAM consume less power compared to a 3.3 V of SDR SDRAM.

The SDRAM controller 13 can support the above mentioned two types of SDRAM 14, because the data can be electrically stored and the storing/retrieving operation can be synchronized, and therefore the data storage device 1 of the present invention can have the advantages of longer work life and accurate storing/retrieving of the data.

Thus the SDRAM controller 13 can control one or plural SDRAM 14. When a plurality of SDRAM is used, the SDRAM 14 may be a stacked structure providing a larger memory capacity. The SDRAM 14 has the advantages of less break down chances, occupies smaller space, and lower manufacturing cost. Besides, the data storage device 1 of the present invention has a longer work life and is capable of accurately storing/retrieving data.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

The invention claimed is:

1. A data storage device using SDRAM, comprising:
   a data transmission converting interface, connecting to a server for converting a data transmitted by said server into storable data;
   a buffer, connecting to said data transmission converting interface for temporarily storing said data converted by said data transmission converting interface;
   a direct memory storing/retrieving controller, connecting to said buffer;
   at least one SDRAM, connecting to said direct memory storing/retrieving controller; and
   a SDRAM controller, connecting to said direct memory storing/retrieving controller for controlling said SDRAM, for enabling said direct memory storing/retrieving controller to move said data temporarily stored in said buffer for storing into said SDRAM,
   wherein said device is connected to a CCD through said data transmission converting interface, wherein a current signal retrieved by said CCD is converted by said data transmission converting interface into storable data that can be temporarily stored in said buffer, and wherein when said SDRAM controller controls the direct memory storing/retrieving controller again, said direct memory storing/retrieving controller will move said data temporarily stored in the buffer for storing into said SDRAM.

2. The data storage device according to claim 1, wherein said server is comprised of a computer.

3. The data storage device according to claim 1, wherein said data transmission converting interface is connected to said server using a wire for data transmission.

4. The data storage device according to claim 1, wherein said data transmission converting interface is wirelessly connected to said server for data transmission.

5. The data storage device according to claim 1, wherein said data transmission converting interface is connected to said CCD using a wire for data transmission.

6. The data storage device according to claim 1, wherein said data transmission converting interface is connected wirelessly to said CCD for data transmission.

7. The data storage device according to claim 1, wherein said SDRAM is comprised of a DDR SDRAM.

8. The data storage device according to claim 1, wherein said device further comprises a power management module and a dry cell, wherein when said power management module detects a low power supply to said data storage device, said power management module switches to said dry cell for supplying power to said SDRAM to enable said SDRAM to refresh.

9. A data storage device using SDRAM, comprising:
   a data transmission converting interface, connecting to a server for converting a data transmitted by said server into storable data;
   a buffer, connecting to said data transmission converting interface for temporarily storing said data converted by said data transmission converting interface;
   a direct memory storing/retrieving controller, connecting to said buffer;
   at least one SDRAM, connecting to said direct memory storing/retrieving controller; and
   a SDRAM controller, connecting to said direct memory storing/retrieving controller for controlling said SDRAM, for enabling said direct memory storing/retrieving controller to move said data temporarily stored in said buffer for storing into said SDRAM,
   wherein said device is connected to a CMOS image sensing element through said data transmission converting interface, wherein a current signal retrieved by said CMOS image sensing element is converted by said data transmission converting interface into storable data that can be temporarily stored in said buffer, and wherein when said SDRAM controller controls the direct memory storing/retrieving controller again, said direct memory storing/retrieving controller will move said data temporarily stored in the buffer for storing into said SDRAM.

10. The data storage device according to claim 9, wherein said server is comprised of a computer.

11. The data storage device according to claim 9, wherein said data transmission converting interface is connected to said server using a wire for data transmission.

12. The data storage device according to claim 9, wherein said data transmission converting interface is wirelessly connected to said server for data transmission.

13. The data storage device according to claim 9, wherein said data transmission converting interface is connected to said CMOS image sensing element using a wire for data transmission.

14. The data storage device according to claim 9, wherein said data transmission converting interface is connected wirelessly to said CMOS image sensing element for data transmission.

15. The data storage device according to claim 9, wherein said SDRAM is comprised of a DDR SDRAM.

16. The data storage device according to claim 9, wherein said device further comprises a power management module and a dry cell, wherein when said power management module detects a low power supply to said data storage device, said power management module switches to said dry cell for supplying power to said SDRAM to enable said SDRAM to refresh.

* * * * *